United States Patent [19]

Cook

[11] 3,939,514
[45] Feb. 24, 1976

[54] APPARATUS FOR CLEANING THIN, FRAGILE WAFERS OF A MATERIAL

[75] Inventor: Richard L. Cook, Seneca Falls, N.Y.

[73] Assignee: Kayex Corporation, Rochester, N.Y.

[22] Filed: Nov. 11, 1974

[21] Appl. No.: 522,786

[52] U.S. Cl................. 15/21 C; 15/70; 15/74; 51/112
[51] Int. Cl.² .......................... A46B 13/04
[58] Field of Search.......... 15/21 D, 21 C, 21 B, 74, 15/70, 88; 51/76 R, 80 A, 112

[56] References Cited
UNITED STATES PATENTS

| | | | |
|---|---|---|---|
| 949,381 | 2/1910 | Polk | 15/21 C |
| 3,311,940 | 4/1967 | Spittler | 15/88 |

Primary Examiner—Edward L. Roberts
Attorney, Agent, or Firm—Lloyd F. Seebach

[57] ABSTRACT

Apparatus is disclosed by which a number of thin, disc-like wafers are moved in a linear path and fed into such path on a discrete basis from a supply or feeding station. The individual or discrete wafers are moved into engagement with a pair of endless belts which, in effect, define the linear path and are arranged one over the other with the facing portions of the belts being spaced apart by at least the diameter of the wafers to be interposed therebetween. As the wafers are moved through the linear path by the belts, they are moved between pairs of brushes, each of a pair being rotatably mounted on a respective side of the path for engaging and cleaning the surfaces of the wafer, the pairs of brushes extending in the direction of movement of the wafers. The belts and the brushes are coupled to drive means such that the rotary forces applied to the surfaces of the wafers by each pair of brushes is nullified to the extent that rotation of the wafers in one direction and movement along the path by the belts is not inhibited.

19 Claims, 7 Drawing Figures

APPARATUS FOR CLEANING THIN, FRAGILE WAFERS OF A MATERIAL

FIELD OF THE INVENTION

The invention relates to apparatus for cleaning a thin wafer of a material and, more particularly, to apparatus in which discrete wafers are moved relative to a plurality of pairs of tandemly arranged brushes which clean both sides or surfaces of the wafer and in which the wafers are rotated as they are moved through a predetermined linear path which includes washing, rinsing and drying of each wafer.

DESCRIPTION OF THE PRIOR ART

In the manufacture of semiconductor elements, individual wafers are cut from a billet of material into very thin wafers which are ultimately cut into small pieces to form diodes and other electronic elements. However, when the wafers are cut from a billet and then lapped and polished, various types of cutting lubricants are utilized. Such lubricants leave a residual film on each surface of the wafer, as well as a slurry of the lubricant and the particles of the semiconductor material removed by lapping, etc., which must be removed prior to any further manufacturing steps, such as etching. Typical materials that are utilized to form billets or elongated crystals are silicon and germanium. The scrubbing or cleaning of the wafers is usually accomplished by placing each individual slice or wafer in a carrier which then moves and positions the wafer with respect to one or more scrubbing brushes or other cleaning medium. The carrier is usually of such a design that only one surface can be cleaned or that both surfaces but not all of both surfaces of the wafer can be thoroughly cleaned. Inasmuch as the grown billet or crystal is a relatively expensive article it is essential that most, if not all, of each wafer be utilized. Accordingly, it is necessary that the complete surface of the wafer be cleaned so further operations with respect to the wafer are not affected.

There are other disadvantages found in the approach to cleaning such wafers as is known in the prior art. For example, many of the wafers or discs are of variable thickness so that a carrier must be designed so wafers having any variance in thickness from a norm will also be accepted by the carrier. Also, in the growing of a crystal, the diameter may vary considerably. However, this variance is reduced by grinding the peripheral surface of the billet to within an acceptable tolerance so that the diameter of the wafers or discs that are cut from the same billet or crystal will vary in diameter but within the acceptable limit. In any event, it is necessary to provide apparatus which will make provision for such diameter variance. Previously, the handling of wafers with such variance in thickness and/or diameter was accomplished by manual operation and involved handling of the discrete wafers. In such an operation, over or under size wafers can be set aside for individual cleaning at a later time. Both the manual and known automatic handling techniques of the prior art have caused a number of problems with respect to the handling of the wafers per se, notably, edge damage, breakage of the wafer per se, noise problems, ineffective cleaning and, as a result of all of these, an inefficient operation for cleaning the wafers on a production basis.

SUMMARY OF THE INVENTION

One object of the invention is to provide an apparatus by which wafers or silicon or germanium following slicing, polishing and lapping can be cleaned with a minimum of handling and an assured routine by which any residue can be removed from the surfaces thereof.

Another object of the invention is to provide an apparatus in which both surfaces of the silicon or germanium wafer being cleaned is subjected to the same type of cleaning action and in which the entire surface is subjected to the cleaning action.

Still another object of the invention is to provide an apparatus in which the wafer is rotated continuously as it moves through a predetermined path and in which the brushes for cleaning the wafer are rotated in opposite directions relative to each surface to alleviate any force being applied to the wafer which will impede the forward movement and rotation of the wafer.

And still another object of the invention is to provide an apparatus in which a plurality of wafers are moved simultaneously through a predetermined path, one following the other and with respect to tandemly arranged cleaning elements, and in which the wafer movement is both linear and rotary irrespective of the motion of the cleaning elements per se.

And yet another object of the invention is to provide an apparatus in which the movement of a number of wafers through a predetermined path provides a full cycle for cleaning including scrubbing, rinsing and drying of the wafers.

In accordance with the invention, a number of thin, disc-like wafers are moved in a linear path and fed into such path on a discrete basis from a supply or feeding station. The individual or discrete wafers are moved into engagement with a pair of endless belts which, in effect, define the linear path of movement for the wafers. The belts are arranged one over the other with the facing portions of the belts being spaced apart by at least the diameter of the wafers to be interposed therebetween. Each belt is provided with a longitudinal recess in which the wafers are positioned and which frictionally engage the peripheral edges of the wafers for rotating the same in one direction. As the wafers are moved through the linear path by the belts, they are moved between a pair of abrading members or brushes rotatably mounted on each side of the path for engaging and cleaning the respective surfaces of the wafer. The abrading members are arranged in pairs and the number of such pairs extends in the direction of movement of the wafers with each pair of abrading members having a member arranged on each respective side of the path. The belts and the abrading members are coupled to drive means such that the belts and the abrading members are rotated in predetermined directions. The abrading members comprising a pair and adjacent abrading members on the same side of the path are rotated in opposite directions whereby the rotary forces applied to the surfaces of the wafers by each pair of abrading members is nullified to the extent that rotation of the wafers in one direction and movement along the path by the belts is not inhibited. There is means associated with each endless belt for permitting the belt to adjust the spacing between the facing portions thereof to any variance in the diameter of a wafer. The belts are of such a length that the wafers can be moved from a cleaning section into a rinsing section and then beyond the rinsing section into a drying section, after which the wafers are moved into a receiving hopper.

With such continuous linear and rotary movement of the individual wafers, the entire surface of each wafer is cleaned as it is moved along the linear path. Hence, it should be evident to those skilled in the art that the apparatus described hereinabove and to be described in more detail hereinafter eliminates many of the problems paramount with the cleaning, as well as handling, of thin wafers by methods and apparatus described by the prior art. Also, further objects and advantages of the invention will be apparent to those skilled in the art by the description which follows.

DESCRIPTION OF THE DRAWINGS

Reference is now made to the accompanying drawings in which like reference numerals and characters designate like parts and wherein.

DESCRIPTION OF THE PREFERRED EMBODIMENT

Figure 1:
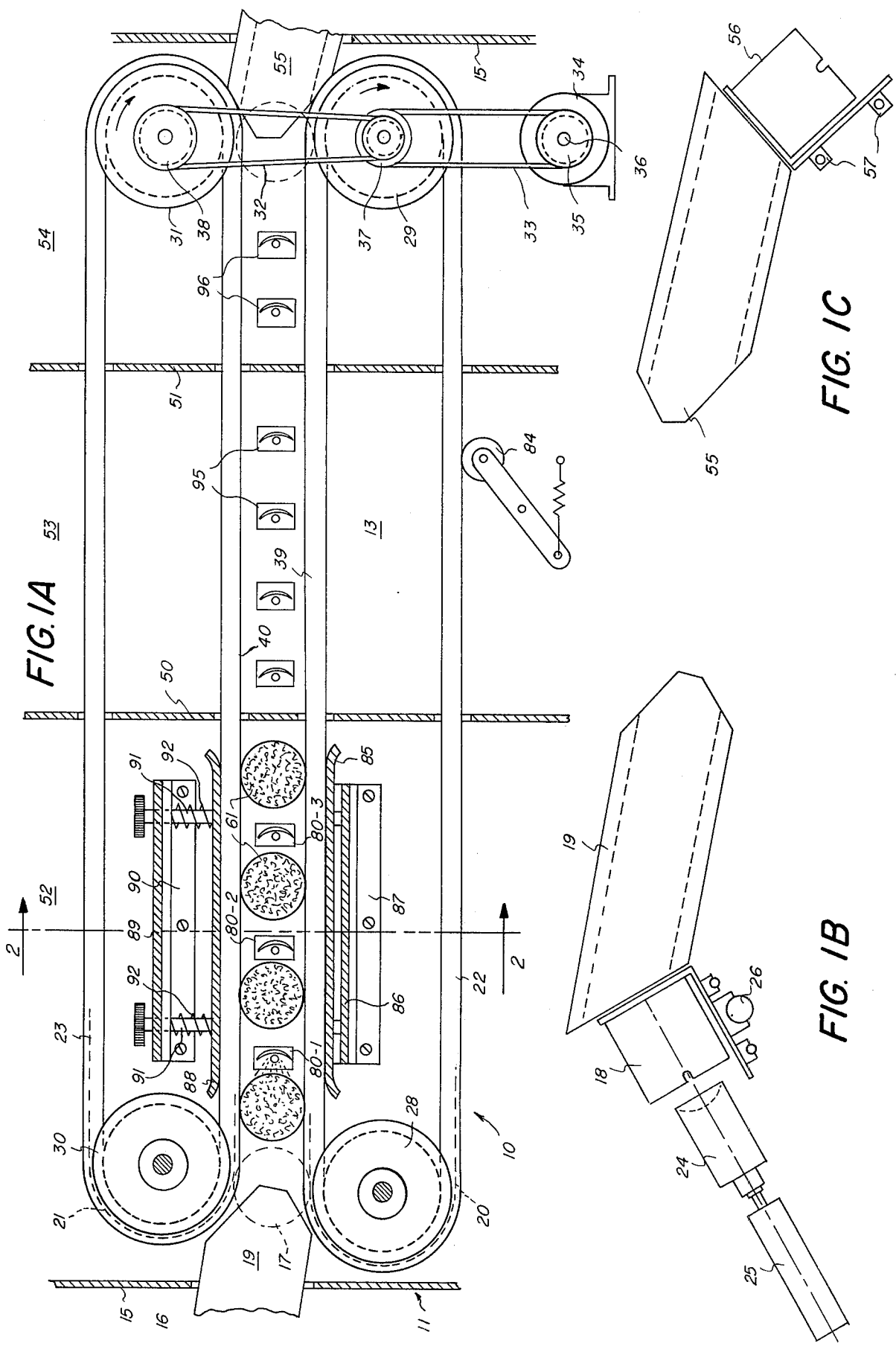
FIG. 1A is a side elevational view of apparatus embodying the invention and showing, in part, each of a cleaning, rinsing and drying section of such apparatus.
FIG. 1B is a side elevational view of a supply or feed station for the wafers that assumes a position relative to the apparatus as shwon in FIG. 1A.
FIG. 1C is a side elevational view of a receiving station for the wafers that assumes a position relative to the apparatus as indicated in FIG. 1A.

With particular reference to FIG. 1A, the apparatus embodying the invention and generally designated by the numeral 10 can be included or arranged in a walled structure 11 which comprises side plates 12 and 13, a bottom flanged plate 14, and end plates 15, the plates 12 and 13 can be of a transparent material in order to better observe the functioning of the apparatus. The plates 12, 13, 14 and 15 are preferably sealed in such a manner as to make the joints therebetween watertight in order to eliminate any seepage or leakage of the cleaning fluid from the structure 11. The end walls 15 at least partially enclose the ends of structure 11 to confine the cleaning liquid or detergent.

At the left-hand side of the apparatus, as viewed in FIG. 1A, a supply or feeding station 16 is arranged so as to feed individual wafers 17 from a magazine 18 into a chute 19, the latter directing the wafers into a recess 20 and 21 in each respective endless belt 22 and 23. The wafers 17 are removed from the magazine 18 and urged into the chute 19 by means of a reciprocating plunger 24 which is intermittently operated by means of an air-operated piston generally designated by the numeral 25. With such an arrangement, the magazine 18 can be spring biased for movement along a rod or rods 26 so as to position successive wafers relative to the chute 19. Obviously, other wafer feeding means can be used, the primary requisite being that the wafers 17 be moved one by one into the chute 19, the latter being inclined so each wafer rolls by the force of gravity toward the endless belts 22 and 23.

The endless belts 22 and 23 are arranged between pulleys 28, 29 and 30, 31, each pair of pulleys being interconnected by a drive belt 32 and by a belt 33 to a motor 34, such an interconnection being made via a pulley 35 on the motor shaft 36, a pulley 37 on the shaft carrying pulley 29, and a pulley 38 on the shaft carrying pulley 31. The facing portions 39 and 40 of each respective belt 22, 23 are spaced from one another by a distance sufficient to accommodate the diameter of the discrete wafers 17 that are moved thereby in the linear path formed by the facing portions 39 and 40. The facing portion can be defined as the length of the belt that forms the linear path of movement of the wafers 17 from chute 19 to chute 55. Since the wafers 17 move into engagement with the recesses 20 and 21 in the belts 22 and 23, the spacing must be such that the periphery of the wafers is frictionally engaged by the recesses in order that the wafers will be moved through the path and at the same time will be rotated by the belts 22 and 23. In order to obtain both the linear and the rotary movement of the discrete wafers 17, the facing portions 39, 40 of the belts 22 and 23, as described above, must be moved in opposite directions and at different linear speeds, the belt being moved at a faster rate determining the direction of rotation of the wafers.

As seen in FIG. 1A, partitions 50 and 51 divide the length of the apparatus 10 into several compartments or sections. The first compartment 52, into which the wafers 17 are first introduced, is the cleaning section. The second compartment 53 between partitions 50 and 51 provides a section in which the wafers 71 are subjected to a rinsing liquid. The wafers 17 are then moved into a third compartment 54 in which air, or other inert gases, can be circulated or applied directly to the wafers as in compartment 53 to dry the wafers before they are moved into chute 55. The cleaned wafers are directed into a receiving magazine 56 by chute 55. The magazine 56 can be moved intermittently along guide rods 57 to accommodate the receipt of the wafers 17 in accordance with the rate of movement of the belts 22 and 23 and wafers 17.

Figure 2:
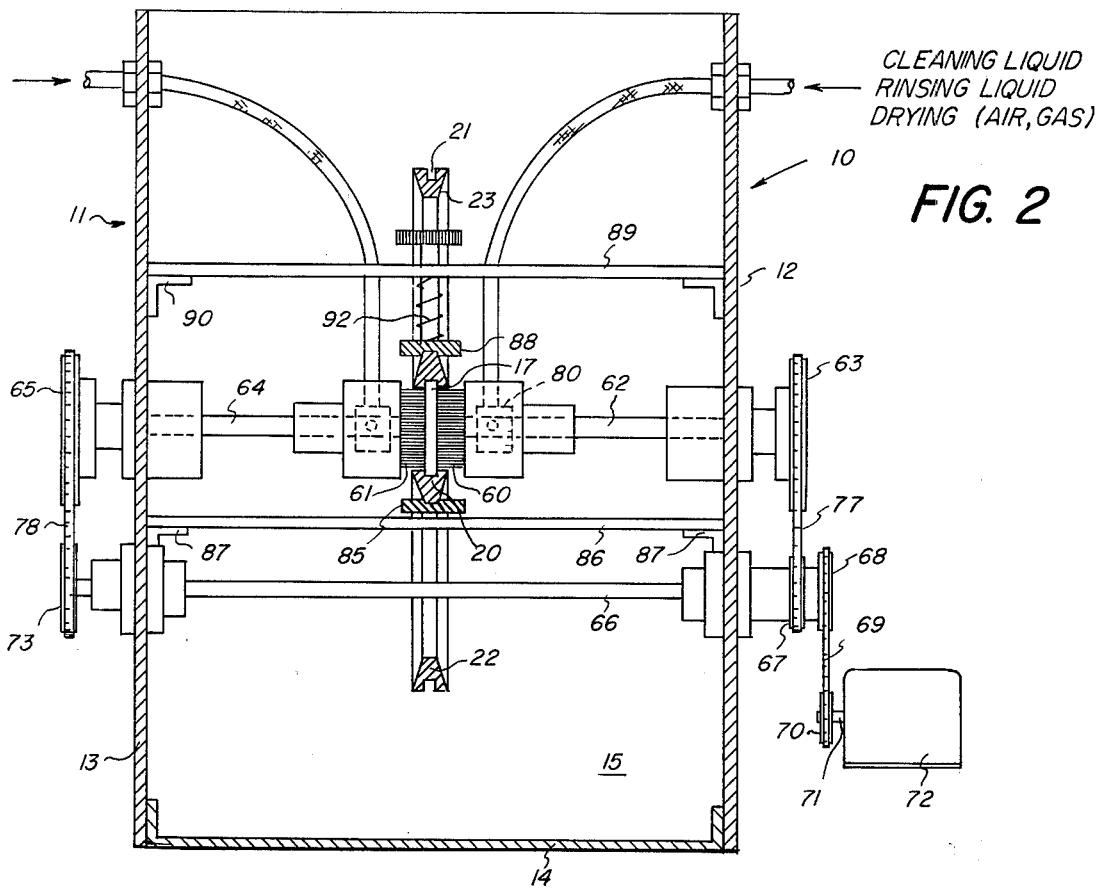
FIG. 2 is an end elevational view taken substantially along the line 2—2 in FIG. 1A to show the interrelationship of the wafer being cleaned to the brushes on each side thereof.

In the cleaning compartment 52, a plurality of pairs of brushes are mounted, as about to be described, for simultaneously cleaning both surfaces of each wafer. With particular reference to FIG. 2, a brush 60 and 61 is rotatably mounted on each side of the path of movement of the wafers 17. The brush 60 is fixed to a shaft 62 that is journalled in the wall or plate 12 and has fixed thereto a sprocket 63. In a like manner, the brush 61 is fixed to a shaft 64 that is journalled in plate 13 and has fixed thereto a sprocket 65. As seen in FIG. 1A, a number of such pairs of brushes 60, 61 are mounted in compartment 52 between the facing portiond 39, 40 of the belts 22, 23.

A drive shaft 66 is journalled at one end in the wall 12 and at the other end in the wall 13. With respect to the wall 12, the shaft 66 carries a sprocket 67 and a sprocket or pulley 68 which engages a chain or belt 69 which, in turn, engages a sprocket or pulley 70 on the shaft 71 of a motor 72. The other end of shaft 66 carries a sprocket 73.

Figure 3:
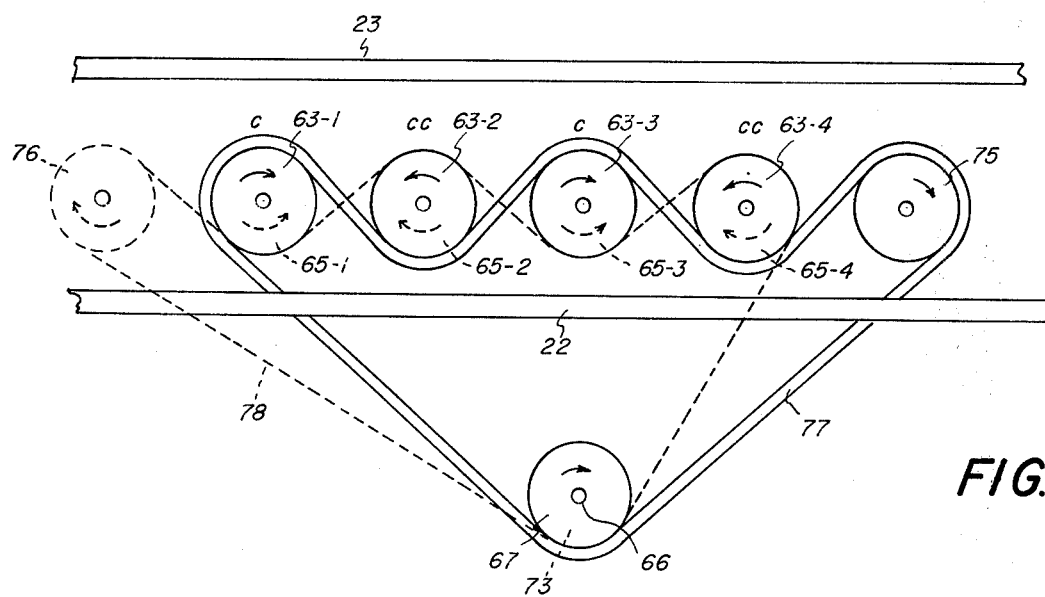
FIG. 3 is a diagramatic side elevational view of an arrangement of drive members for moving or rotating the brushes on each side of the wafer path of movement in an opposite direction.

Assuming four pairs of brushes 60, 61 are arranged in tandem in compartment 52, then four sprockets 63-1 to 63-4 will be arranged as seen in FIG. 3 when viewed from the right side in FIG. 2, both with respect to plate 12 and to plate 13. With respect to both the drive rotatably mounted on plate 12 and the drive rotatably mounted on plate 13, an idler sprocket 75, 76 is required for each drive in order to obtain the desired direction of rotation of each pair of brushes 60 and 61. With respect to the drive arrangement in FIG. 3, the sprockets 63-1 to 63-4 are rotated in opposite directions by the chain 77 also engaging sprocket 67, the first 63-1 being clockwise, the next 63-2 being counterclockwise, the following 63-3 being clockwise, and the last 63-4 being counterclockwise. The idler sprocket 75 is then arranged relative to the sprocket 63-4 in order to complete the drive with the proper direction. With respect to the drive mechanism mounted on the side of plate 13, the sprockets 65-1 to 65-4 and the idler sprocket 76 are interconnected by chain 78 to sprocket 73 with idler sprocket 76 mounted ahead of sprocket 65-1. The sprocket 65-1 is aligned with sprocket 63-1 and carries the first of brushes 61 which is rotated in a counterclockwise direction. The drive arrangement by chain 78 will then provide a direction of rotation for each pair of brushes and for adjacent brushes on the same side of the wafers that are of opposite hands. Accordingly, the brushes 60 and 61 that are axially aligned with one another rotate in opposite directions and, as a result, no force is exerted on the wafers at any time that will tend to impart rotary motion to the wafers. Consequently, the rotative force of one brush is offset by that of another and the only force tending to move the wafers in a direction along the linear path defined by the belts is the frictional engagement of the wafer with the recesses 20, 21 in the spaced-apart belts 22, 23. Since the wafers 17 are moved relative to the brushes and engaged only at the peripheral edge and are rotated as well as moved in an axial direction, the full surface of each wafer is exposed to the brushes during its movement through the compartment 52. In this way, the entire area comprising each surface of the wafer is contacted by the brushes and no portion of the wafer is not thoroughly cleaned.

As seen in FIGS. 1A and 2, a spray nozzle or jet 80-1 to 80-3 is arranged relative to each brush 60, 61 for introducing a cleaning fluid at or near the proximity of engagement of each brush with the respective surfaces of the wafers 17. Each nozzle can be mounted on the end of a flexible tube that is mounted with respect to either of walls 12 or 13. This cleaning fluid can be in the form of a detergent, or other cleaning medium, depending on the residual material that is to be removed from the surfaces of the wafers. The cleaning fluid drains to the bottom of the unit and plate 14 is provided with suitable drains, not shown. In many instances, the cleaning medium or fluid can drain into a reservoir and be recycled for reapplication to the wafers.

In the compartment or section 52 in which the wafers 17 are actually scrubbed and cleaned, a fixed plate 85 is arranged between the plates 12 and 13 and in engaging relation with the facing portion 39 of belt 22. The plate 85 is mounted on a support plate 86 which in turn is mounted on angle members 87 secured to each of plates 12 and 13. This structure provides a partial support and guide for the facing portion 39 of belt 22 to eliminate any possible sway and/or sagging of the belt with the wafers therebetween. Immediately above the plate 85 is a resiliently mounted plate 88 which engages the facing portion 40 of the belt 23 as a guide therefor, as shown in FIG. 1A. Plate 88 is mounted relative to a fixed plate 89 that extends between the side plates 12 and 13 and is supported by angle members 90. The plate 88 carries spaced-pins 91 that are movable in plate 89. Pins 91 are encircled by springs 92 so as to permit the plate 88 to move relative to the fixed plate 89 and to the facing portion 40 of the belt 23. With this arrangement, any variance in the diameter of the wafers 17 can be accommodated for without interfering with the axial and rotational movement of the wafers. Although, not shown, the same plate structure 85, 88, 89 can be provided and, preferably, is also provided in the rinsing and drying compartments 53 and 54. A resiliently biased roll 84 can be arranged with respect to belt 22 and also belt 23, as shown in FIG. 1A, to maintain proper belt tension.

In the rinsing compartment 53, a plurality of spray nozzles 95 are arranged in spaced relation along the linear path of movement of the wafers 17 for applying a steady spray or stream of deionized (D.I.) water onto the surfaces of the wafers being moved therethrough. In the drying compartment 54, a similar arrangement of nozzles 96 can be provided to supply a flow of heated air or an other inert gas to effectively and quickly dry the wafers. On the other hand, the compartment 54 can be provided with a continuous flow of air, or heated air, that is circulated through the compartment for drying the wafers being moved therethrough. It should be pointed out that the length of the compartments 52, 53, 54 can vary depending on the requirements of the system. For example, if more or less cleaning action is required, it may be necessary to increase or decrease the number of pairs of brushes 60, 61 that are used to clean the wafers 17. On the other hand, shorter or longer periods of time in either or both of the rinsing compartment 53 and the drying compartment 54 may be needed to accomplish satisfactory rinsing and/or drying of the wafers 17.

In a cycle of operation, the wafers 17, after having been cut from a billet, lapped and polished, are arranged in a magazine 18 that is positioned relative to the chute 19 for introduction thereinto, one by one, for delivery into and between the belts 22 and 23. The introduction of the wafers 17 is into the recesses 20, 21 provided in the belts 22, 23 and these recesses frictionally engage the peripheral edge of the individual wafers. As the wafers are moved by the belts 22, 23 through the cleaning compartment 52, they are moved into and out of engagement with each pair of brushes 60, 61. With any variation in the diameter of the wafers 17, the plate 87 permits the facing portion 40 of the belt 23 to move in either direction to accommodate for such variance to maintain frictional engagement of the belts with the peripheral edge of the wafer so that it is moved not only axially but also rotated. As pointed out hereinabove, each brush 60, 61 comprising an axial pair is rotated in an opposite direction. Also, each corresponding brush in an adjacent pair of brushes is rotated in a different direction. Accordingly, the overall effect of the rotating brushes is to nullify any force that might be applied by the brushes to the surfaces of the wafers. With this construction, the belts 22 and 23 provide the sole means for moving the wafers 17 in their linear path through the cleaning 52, rinsing 13, and drying 54 compartments. The linear and rotary motion of the wafers 17 continues as they are moved through each of the compartments. Hence, in each compartment the action is with respect to both surfaces of the wafer. In other words, both surfaces of each wafer are subjected to the action in any one of the compartments 52, 53, 54. Because the wafers are rotated, the full extent of each surface is acted upon in each compartment. The belts 22, 23 then move the wafers 17 into the chute 55 which directs them into the magazine 56 for eventual removal from the apparatus when the magazine is completely full.

Modifications of the apparatus described hereinabove can be made to provide a more versatile apparatus. In the above-described embodiment, the belts 22, 23 can be driven by separate drives in order to more effectively regulate the speed of the belts relative to one another. Also, a separate drive can be used for the brushes 60 on one side of the wafers 17 and for the brushes 61 on the other side. Again, better control of the speed of each set of brushes will provide more uniform action relative to nonmovement of the wafers and, at the same time, a more uniform cleaning action.

Figure 4:
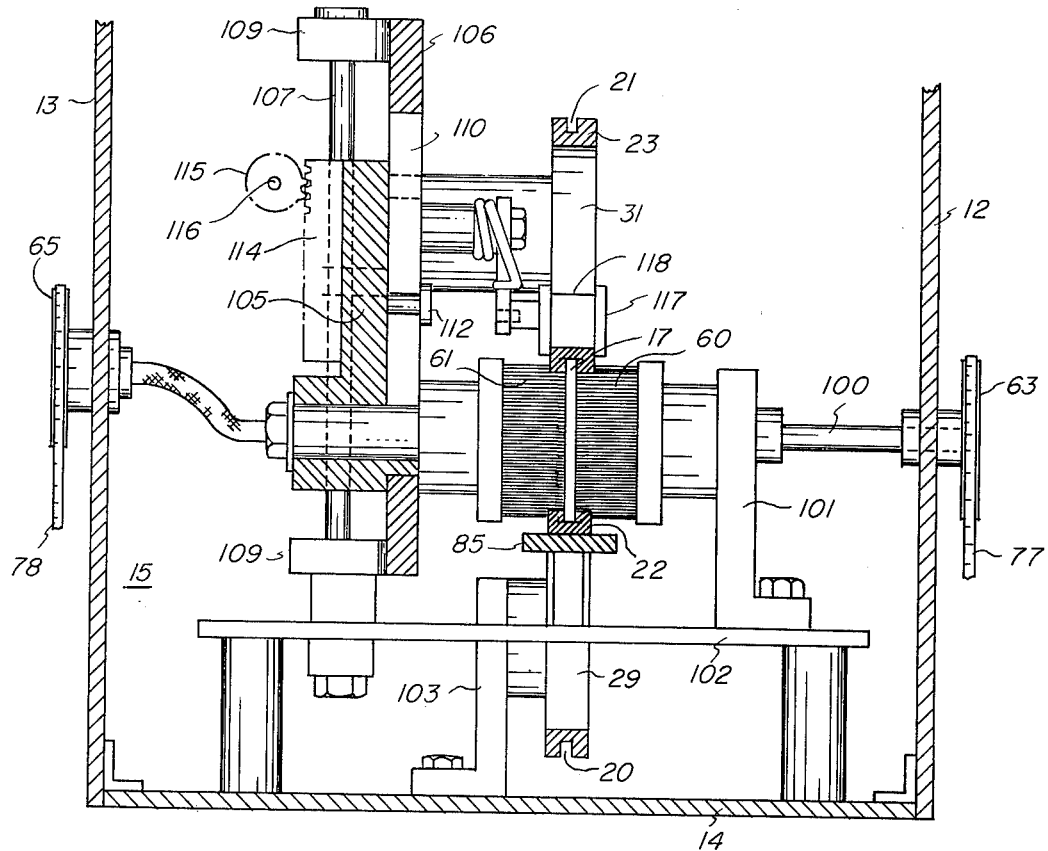
FIG. 4 is an end elevational view similar to FIG. 2 showing another embodiment of the invention in which the spacing of the brushes and of the belts can be adjusted to accommodate the apparatus to wafers of a larger diameter.
Figure 5:
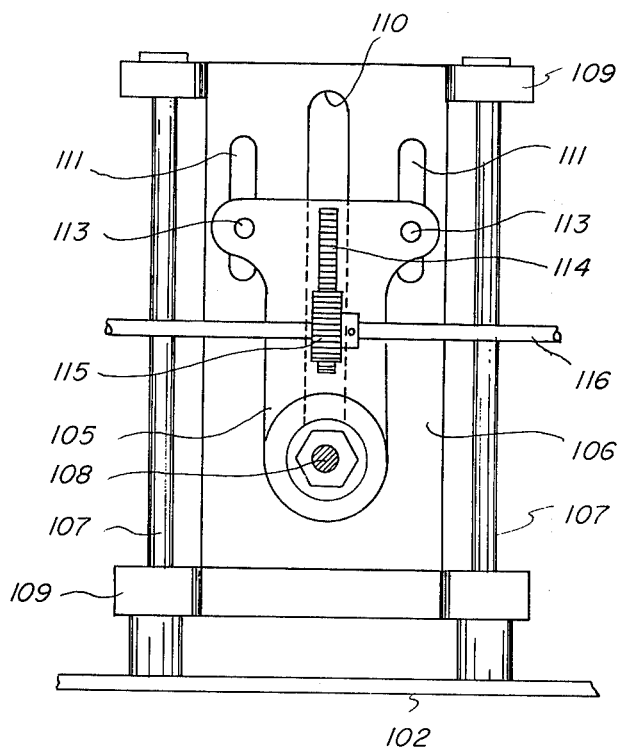
FIG. 5 is an end elevational view of the supporting structure for the brushes that are adjustable, as shown in FIG. 4.

With reference to FIGS. 4 and 5, another embodiment of the invention is disclosed in which one of the belts 22, 23 can be displaced relative to the other, as well as the brushes 60, 61 on one side of the wafers 17 relative to those on the other side. Such an arrangement permits the apparatus 10 to be accommodated to wafers cut from billets of different diameter in the range of from about 1 inch to about 5 inches with or without any necessity for changing the size or diameter of the brushes 60, 61.

In the disclosure shown in FIG. 4, the belt 22 and the brushes 60 are fixed in position and the belt 23 and the brushes 61 are movable in a vertical direction to permit wafers 17 of a larger diameter to be cleaned. Each of brushes 60 is mounted on a shaft 100 that is journalled in a bracket 101 and the side plate 12. The bracket 101 is fixed to plate 102 that is fixedly mounted in spaced relation to the bottom plate 14. A sprocket 63 is fixed to each of shafts 100 and interconnected by a chain drive 77 similar to that described above so that each of adjacent sprockets 63 is driven in an opposite direction. Also, each of pulleys 28, 29 is rotatably mounted in a bracket 103 that is fixed to plate 14. In this way, belt 22 as well as fixed plate 85, are maintained in the same relationship as defined above.

Each of the brushes 61 is rotatably mounted in a bracket 105 that is slidably mounted relative to a bracket 106 that is mounted in fixed relation to plate 102 by means of spaced rods 107, on FIG. 5. Sprockets 65 are rotatably mounted on side plate 13 and each sprocket is interconnected to a respective brush 60 by a flexible shaft 108. In this way the drive chain 78 and sprockets 65 can be fixed and yet permit movement of the brushes 61 relative thereto. At this point it should be mentioned that brushes 60 and 61 will be independently driven and in the same directional relationship as described above, that is, aligned brushes 60 and 61 will be rotated in opposite directions, adjacent brushes 60 will be rotated in opposite directions and adjacent brushes 61 will also be rotated in opposite directions. Accordingly, the same driving relationship will exist as described above with respect to FIG. 3.

Each of brackets 106 is provided with spaced and aligned ears 109 in which rods 107 are positioned for mounting the bracket. A slot 110 and a pair of slots 111, see FIG. 5, receive suitable pins 112 and 113 for guiding bracket 105 in its vertical movement, about to be described. Bracket 105 carries a rack 114 which is engaged by a pinion 115 that is secured to a shaft 116 extending at least the length of compartment 52 and having external means connected thereto for rotating the shaft 116. Accordingly, rotation of shaft 116 in one direction will move bracket 105 in an upward direction and in the other direction in a downward direction. Since each of brushes 61 is carried by a bracket 105, the brushes 61 will be moved as a unit relative to the brushes 60. While not shown in detail, each of pulleys 30 and 31 are also mounted in a manner similar to that described above and moved by a rack and pinion arrangement that is correlated with that of rack 114 and of pinion 115. In this way, both the brushes 61 and the pulleys 30, 31 with belt 23 can be moved relative to brushes 60 and belt 22 to accommodate the apparatus to the cleaning batches of wafers which can be of different diameters.

In FIG. 4, a spring-biased roller 117 is pivotally mounted on each of brackets 106. The roller is provided with a recess 118 which contacts belt 23 and serves to guide the belt and to prevent any side sway or whip. Such a roller can be used in place of guide plate 88 described hereinabove. As a matter of fact, plates 85 and 88 can also be provided with longitudinal slots for the same guiding and anti-swaying function relative to belt 23. With either arrangement, a tension roller 84 can still be used with respect to each of belts 22 and 23.

With the embodiment just described, it will be evident that magazines 18 and 56 will have to be of a size to accommodate the wafers being cleaned. It is also conceivable that means can be provided in conjunction with the rotation of shaft 116 to indicate the belt separation, or the diameter of the wafer that can be accommodated. Also, if each group of brushes 60, 61 and each belt 22, 23 is provided with its own drive mechanism, variable speed drives can be used which will permit very accurate control of the speeds so as to obtain an optimum operating condition as related to wafer rotation and longitudinal movement.

It should also be pointed out that certain variations of the embodiments described above can be made without departing from the spirit of the invention. Since the diameter of a lot of wafers to be cleaned can vary from about one to about five inches, it is necessary to consider the effect of the diameter of the brush that is to be used. Obviously, the problem would be greatly simplified if the wafers were of one size so that brushes of generally the same size could be used. In this case the brushes would be of generally the same diameter as the wafers and axially aligned with the center line of movement of the wafers along the path. However, when one of the belts 22, 23 is made adjustable relative to the other, certain conditions relative to the brushes 60, 61 must also be taken into consideration, if wafers of different diameters are to be accommodated by the apparatus. If the brushes 60, 61 comprising a pair are axially aligned with each other and the center line of the path, then the brush diameter can be relatively small and full surface cleaning will be effected due to the rotary and linear movement of the wafers by the belts. On the other hand, if the brushes comprising a pair are axially aligned but displaced from the center line of the path toward one of the belts, then the diameter of the brushes must be at least equal to the radius of the wafers being cleaned in order to obtain full surface cleaning action. Brushes of any smaller diameter will leave at least one annular ring on the wafer that will not be cleaned depending on the diameter of the brush and its displacement relative to the path center line.

While the above embodiments are described with respect to brushes that are of generally the same size as the wafers being cleaned and in which each pair of brushes and adjacent brushes on the same side of the path are rotated in opposite directions, this mode of operation has been found to be most satisfactory. However, the same direction of rotation can be imparted to the brushes on the same side of the path, so long as the directions of rotation are opposed as to each pair of brushes. It is of importance that the force exerted by the brushes on the surface of the wafers as well as torque exerted on the wafers be nullified by each pair of brushes so the rotary and linear motion of the wafers by the belts is not inhibited. These same conditions must exist with respect to the adjustable brushes in any position they might assume relative to the wafers being cleaned.

From the foregoing description, it should be readily apparent to one skilled in the art that the apparatus so described provides for simultaneous cleaning of both sides of a wafer without any manual handling and any possibility of edge damage and breakage. The manner in which the wafers are moved provides for more effective cleaning and is fully automatic, thereby resulting in an increased production rate.

The invention has been described in detail with particular reference to the preferred embodiment thereof. It will be understood that variations and modifications can be effected within the spirit and scope of the invention.

I claim:

1. Apparatus for simultaneously cleaning the surfaces of a number of thin, disc-like wafers being moved in a linear path comprising, in combination:
   at least one pair of endless belts defining the linear path of movement for the wafers, one belt being arranged relative to the other with the facing portions of the belts being spaced apart by at least the diameter of the wafers interposed therebetween so as to frictionally engage the peripheral edges thereof for simultaneously moving and rotating the wafers in one direction along the path;
   a plurality of abrading members rotatably mounted on each side of the path for engaging and cleaning the respective surfaces of the wafers, the abrading members being arranged in pairs along the path and each pair comprising an abrading member on each respective side of the path; and
   drive means operatively coupled to the belts for moving one belt at a faster rate than the other for imparting rotary motion to the wafers in a direction corresponding to that of the faster moving belt and to the abrading members for rotating the same, the abrading members comprising a pair being rotated in opposite directions, the rotary forces applied to surfaces of the wafers by each pair of abrading members being nullified to the extent that rotation of the wafers in the one direction and movement along the path by the belts is not inhibited.

2. Apparatus in accordance with claim 1 wherein the abrading members on the same side of the path are rotated in the same direction.

3. Apparatus in accordance with claim 1 wherein adjacent abrading members on the same side of the path are rotated in opposite directions.

4. Apparatus in accordance with claim 1 including means associated with each abrading member on each side of the path for introducing a cleaning solution to the abrading member generally near the plane of the surface of the wafer engaged by the abrading member.

5. Apparatus in accordance with claim 1 including means associated with each endless belt for permitting the belts to adjust the spacing between the facing portions to any variance in the diameter of the wafers.

6. Apparatus in accordance with claim 1 wherein a number of pairs of endless belts are arranged in tandem for extending the length of the path.

7. Apparatus in accordance with claim 1 wherein the plurality of abrading members are brushes of generally cylindrical shape and comprises a number of groups of pairs spaced along the path for cleaning the wafers, each such group preceding a section through which the wafers are moved by the belts for rinsing the cleaning solution therefrom.

8. Apparatus in accordance with claim 7 including a drying section arranged beyond the last rinsing section in the path and through which the wafers are moved by the belts.

9. Apparatus in accordance with claim 1 wherein each belt is provided with a longitudinal open-end recess, the recesses facing one another for engaging the peripheral edge of the wafers interposed therebetween and being of such a size as to permit rotation of the wafer in the recesses while being moved along the path by the belts.

10. Apparatus in accordance with claim 9 including means arranged at one end of the belts for successively feeding discrete wafers into the belt recesses and between the facing portions of the belts and means arranged at the other end of the belts for receiving the cleaned wafers.

11. Apparatus in accordance with claim 7 including means associated with the facing portions of the belts being moved relative to each group and section for permitting the belts to adjust the spacing between the facing portions in accordance with any variance in the diameter of the wafers therebetween.

12. Apparatus in accordance with claim 11 wherein the variance permitting means comprises a fixed member arranged relative to and engaging at least a part of one facing portion of the belts that is opposite that engaging the wafer and a resiliently biased member arranged relative to an engaging at least an equivalent part of the facing portion of the other belt that is opposite that engaging the wafer.

13. Apparatus in accordance with claim 9 wherein the open-end recess in each belt is generally rectangular and continuous with its respective belt and at least the side of the recess opposite the open end frictionally engages the peripheral edge of the wafers.

14. Apparatus in accordance with claim 1 wherein the facing portions of the belts contacting the peripheral edges of the wafers are movable in opposite directions and at different linear speeds for imparting linear and rotary movement to the wafers.

15. Apparatus in accordance with claim 1 wherein said drive means comprises a discrete driving mechanism associated with each endless belt and with the abrading members on each respective side of the path.

16. Apparatus in accordance with claim 1 including means for moving one of the endless belts relative to the other to vary the space between the facing portions of the belts so wafers of another diameter can be interposed therebetween.

17. Apparatus in accordance with claim 16 wherein the moving means is coupled to alternate pairs of the abrading members for moving the same in conjunction with the one belt.

18. Apparatus in accordance with claim 16 wherein the moving means is coupled to the abrading members on the same side of the path for moving the same in conjunction with the one belt.

19. Apparatus in accordance with claim 1 wherein the abrading members comprising a pair are axially aligned with the central line of movement of the wafers along the path.

* * * * *